US009013188B2

(12) United States Patent
Nam

(10) Patent No.: US 9,013,188 B2

(45) Date of Patent: Apr. 21, 2015

(54) APPARATUS AND METHOD FOR SENSING FAILURE

(75) Inventor: Kyung Pil Nam, Suwon-si (KR)

(73) Assignee: Samsung Electronics Co., Ltd., Seoul (KR)

( * ) Notice: Subject to any disclaimer, the term of this patent is extended or adjusted under 35 U.S.C. 154(b) by 598 days.

(21) Appl. No.: 13/338,007

(22) Filed: Dec. 27, 2011

(65) Prior Publication Data

US 2012/0182018 A1 Jul. 19, 2012

(30) Foreign Application Priority Data

Jan. 17, 2011 (KR) ........................ 10-2011-0004406

(51) Int. Cl.
*G01R 31/00* (2006.01)
*H05B 33/08* (2006.01)
*H05B 37/03* (2006.01)

(52) U.S. Cl.
CPC ........ *H05B 33/0887* (2013.01); *H05B 33/0893* (2013.01); *H05B 37/034* (2013.01)

(58) Field of Classification Search
None
See application file for complete search history.

(56) References Cited

U.S. PATENT DOCUMENTS

| | | | | |
|---|---|---|---|---|
| 5,397,933 | A | 3/1995 | Yamada | |
| 7,701,151 | B2 * | 4/2010 | Petrucci et al. | 315/309 |
| 7,790,078 | B2 * | 9/2010 | Watanabe et al. | 264/177.11 |
| 2004/0061450 | A1 | 4/2004 | Ito et al. | |
| 2010/0045194 | A1 | 2/2010 | Peker et al. | |
| 2010/0181941 | A1 | 7/2010 | Kuo et al. | |

FOREIGN PATENT DOCUMENTS

| | | | | |
|---|---|---|---|---|
| AT | 507185 | A1 * | 2/2010 | H05B 33/0887 |
| EP | 1 006 759 | A2 | 6/2000 | |
| EP | 1874098 | A1 * | 1/2008 | H05B 33/0887 |
| FR | 2 724 749 | A1 | 3/1996 | |
| JP | 3140830 | U | 3/2008 | |
| KR | 20-0322433 | | 7/2003 | |

OTHER PUBLICATIONS

European Search Report issued in Application No. 12151393.1 issued on Apr. 11, 2012.

Taiwanese Office Action issued in Taiwanese Application No. 100145009 dated Jan. 24, 2014.

* cited by examiner

*Primary Examiner* — Paresh Patel

(74) *Attorney, Agent, or Firm* — McDermott Will & Emery LLP

(57) ABSTRACT

Provided is an apparatus for sensing a failure that may apply, using a current control unit, a current to at least one first light emitting diode (LED) string and at least one second LED string that may be connected in parallel with each other, and as a result of sensing whether a failure occurs with respect to each of the at least one first LED string and the at least one second LED string, when a failure is sensed with respect to at least one of the at least one first LED string and the at least one second LED string, may transmit failure information to the current control unit, thereby blocking the entire current that may be applied to the at least one first LED string and the at least one second LED string, using the current control unit.

13 Claims, 4 Drawing Sheets

APPARATUS AND METHOD FOR SENSING FAILURE

CROSS-REFERENCE TO RELATED APPLICATION

This application claims the priority benefit of Korean Patent Application No. 10-2011-0004406, filed on Jan. 17, 2011, in the Korean Intellectual Property Office, the disclosure of which is incorporated herein by reference.

BACKGROUND

1. Field

Example embodiments relate to an apparatus and method for sensing a failure with respect to a plurality of light emitting diode (LED) strings.

2. Description of the Related Art

A Light Emitting Diode (LED) corresponding to a light emitting device may have been developed in a form wherein a chip may have a predetermined size, for example, $1\times1$ mm$^2$, because of a current injection limit, and the like.

According to recent improvement in light emitting efficiency, the LED has been widely applied from an initial signal display to a light source of a large display apparatus such as a Back Light Unit (BLU) and a Liquid Crystal Display (LCD), and lighting, since the LED consumes less power and lasts longer in comparison with a conventional lighting such as a light bulb and a fluorescent light.

Accordingly, there is a need for multiple LED chips to be manufactured in an array form so that the multiple LED chips may be used in an application outputting large amounts of light, for example, a lighting, a headlamp, and the like that may produce a high light output.

In this instance, an LED string may be manufactured and used by connecting a plurality of separate LED chips in series or in parallel through a wire bonding scheme, or by connecting LED chips on the same substrate through a special process.

Generally, an LED array may include a plurality of strings, and all of the LED strings may need to be connected in series in order to block a power supply of the entire LED when a failure occurs with respect to at least one LED.

In the case that all of the LED strings are connected in series, when an input voltage is lower than a forward voltage drop $V_f$ of the entire LED, a boost circuit may be needed to be applied and accordingly costs may be increased, and an electro-magnetic compatibility (EMC) noise may occur.

SUMMARY

The example embodiments may include an apparatus for sensing a failure of a light emitting diode (LED) string, that may include a current control unit to apply a current to at least one first LED string and at least one second LED string that may be connected in parallel with each other, at least one first failure sensor to sense whether a failure occurs with respect to each of the at least one first LED string, at least one second failure sensor to sense whether a failure occurs with respect to each of the at least one second LED string, and a failure result judgment unit to transmit failure information to the current control unit when a failure is sensed with respect to at least one of the at least one first LED string and the at least one second LED string, as the sensing result of the at least one first failure sensor and the at least one second failure sensor, and when the failure information is received, the current control unit may block the entire current that may be applied to the at least one first LED string and the at least one second LED string.

As the sensing result of the at least one first failure sensor and the at least one second failure sensor, when both the at least one first LED string and the at least one second LED string operate normally, the current control unit may continuously apply the current to the at least one first LED string and the at least one second LED string.

The at least one first failure sensor, the at least one second failure sensor, and the failure result judgment unit may correspond to transistors.

The at least one first failure sensor and the at least one second failure sensor may be turned on when the at least one first LED string and the at least one second LED string operate normally, as the sensing result.

The failure result judgment unit may be turned off to disallow transmission of failure information to the current control unit when both the at least one first failure sensor and the at least one second failure sensor are turned on.

The at least one first failure sensor or the at least one second failure sensor may be turned off when a failure of each of the at least one first LED string and the at least one second LED string is sensed.

The failure result judgment unit may be turned on by applying an input voltage that may be applied from the outside of the at least one first failure sensor or the at least one second failure sensor, and may generate the failure information and may transmit the generated failure information to the current control unit when at least one of the at least one first failure sensor and the at least one second failure sensor is turned off.

The apparatus for sensing the failure may further include a malfunction monitor unit to provide a malfunction result to the current control unit by recognizing whether malfunctions occur with respect to the at least one first failure sensor and the at least one second failure sensor.

The malfunction monitor unit may control the failure result judgment unit to recognize sensing results of the at least one first failure sensor and the at least one second failure sensor when the input voltage is applied greater than a malfunction setting voltage, by applying a voltage equal to the input voltage that may be applied to the current control unit.

The malfunction monitor unit may include an operating voltage setting unit to set the malfunction setting voltage.

The operating voltage setting unit may include at least one resistance, and may set a malfunction setting voltage by distributing the input voltage to the at least one resistance.

The example embodiments may also include a method of sensing a failure of an LED string, that may include applying, by a current control unit, a current to at least one first LED string and at least one second LED string that may be connected in parallel with each other, sensing whether a failure occurs with respect to each of the at least one first LED string and the at least one second LED string, and transmitting failure information to the current control unit when a failure is sensed with respect to at least one of the at least one first LED string and the at least one second LED string, as the sensing result, and blocking the entire current that may be applied to the at least one first LED string and the at least one second LED string, using the current control unit, when the failure information is received Additional aspects of embodiments will be set forth in part in the description which follows and, in part, will be apparent from the description, or may be learned by practice of the disclosure.

BRIEF DESCRIPTION OF THE DRAWINGS

These and/or other aspects will become apparent and more readily appreciated from the following description of embodiments, taken in conjunction with the accompanying drawings of which.

DETAILED DESCRIPTION

Figure 1:
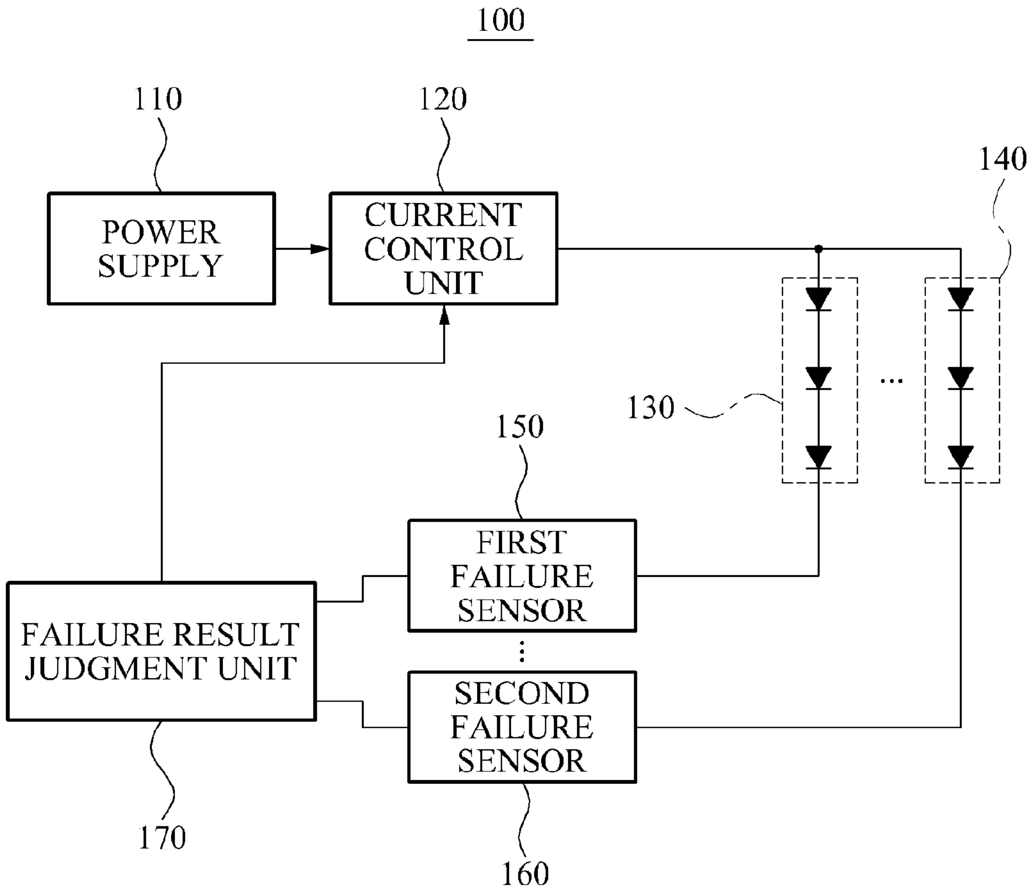
FIG. 1 illustrates a configuration of an apparatus for sensing a failure according to example embodiments.

Reference will now be made in detail to embodiments, examples of which are illustrated in the accompanying drawings, wherein like reference numerals refer to the like elements throughout. Embodiments are described below to explain the present disclosure by referring to the figures.

When it is determined that a detailed description related to a related known function or configuration which may make the purpose of the present disclosure unnecessarily ambiguous in describing the present disclosure, the detailed description will be omitted. Also, terminologies used herein are defined to appropriately describe the exemplary embodiments and thus may be changed depending on a user, the intent of an operator, or a custom. Accordingly, the terminologies must be defined based on the following overall description of this specification. Reference will now be made in detail to exemplary embodiments, examples of which are illustrated in the accompanying drawings, wherein like reference numerals refer to the like elements throughout.

Figure 2:
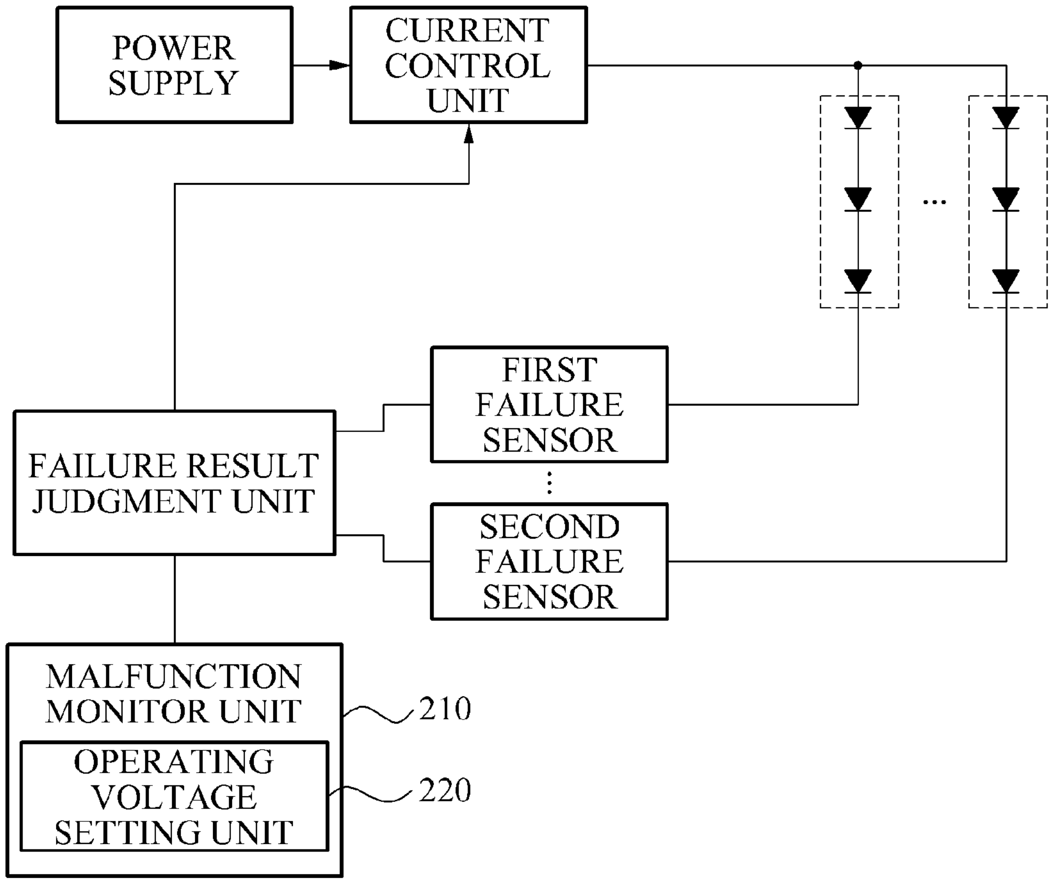
FIG. 2 illustrates another configuration of an apparatus for sensing a failure according to example embodiments.

FIG. 1 illustrates a configuration of an apparatus 100 for sensing a failure, and FIG. 2 illustrates another configuration of the apparatus for sensing the failure, according to example embodiments.

Referring to FIG. 1, the apparatus 100 for sensing the failure may include a current control unit 120, and at least one first light emitting diode (LED) string 130, at least one second LED string 140, at least one first failure sensor 150, at least one second failure sensor 160, and a failure result judgment unit 170.

The apparatus 100 for sensing the failure may sense a failure of an LED that may be arrayed with a plurality of LED strings, for example, an LED array including the at least one first LED string 130, and the at least one second LED string 140, and may block a power supply of the entire LED when a failure occurs with respect to a part of the LED.

Referring to FIG. 2, the apparatus 100 for sensing the failure may further include a malfunction monitor unit 210 including an operating voltage setting unit 220.

A method of sensing a failure of an LED arrayed with a plurality of strings, using the apparatus 100 for sensing the failure, as well as a configuration of the apparatus 100 for sensing the failure will be further described.

Figure 3:
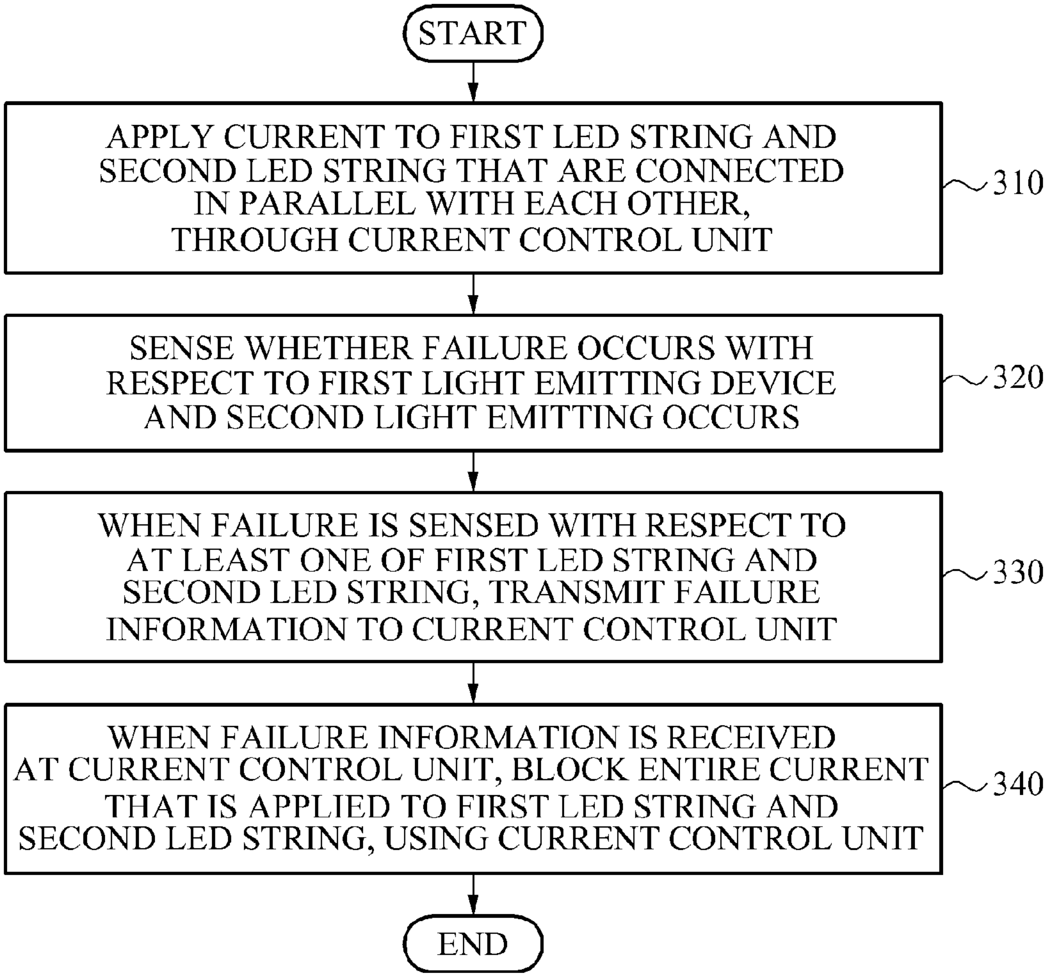
FIG. 3 illustrates a method of sensing a failure according to example embodiments.
Figure 4:
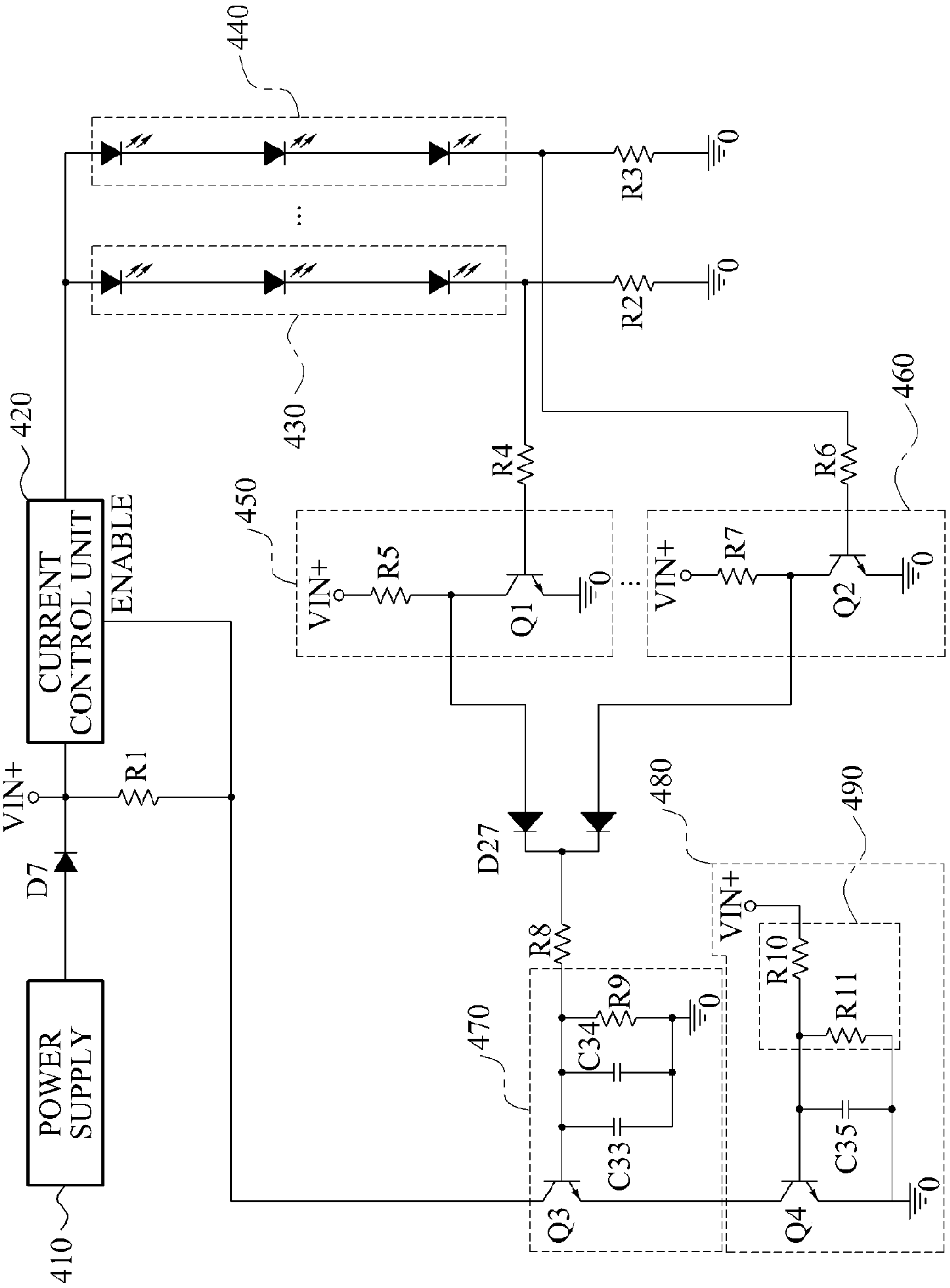
FIG. 4 illustrates a circuit of an apparatus for sensing a failure according to example embodiments.

FIG. 3 illustrates a method of sensing a failure and FIG. 4 illustrates a circuit of an apparatus for sensing a failure, according to example embodiments.

Referring to FIGS. 3 and 4, the apparatus 100 for sensing the failure may apply a current from a power supply 410 to at least one first LED string and at least one second LED string that may be connected in parallel with each other, using a current control unit 420, in operation 310.

In operation 320, at least one first failure sensor 450 may sense whether a failure occurs with respect to each of the at least one first LED string 430, and at least one second failure sensor 460 may sense whether a failure occurs with respect to each of the at least one second LED string 440, thereby monitoring the entire LED strings that may be connected in parallel with one another.

In operation 330, as a sensing result of the at least one first failure sensor 450 and the at least one second failure sensor 460, when a failure is sensed with respect to at least one of the at least one first LED string 430 and the at least one second LED string 440, a failure result judgment unit 470 may transmit failure information to the current control unit 420.

In operation 340, when the failure information is received, the current control unit 420 may block the entire current that may be applied to the at least one first LED string 430 and the at least one second LED string 440.

As a sensing result of the at least one first failure sensor 450 and the at least one second failure sensor 460, when both the at least one first LED string 430 and the at least one second LED string 440 operate normally, the current control unit 420 may continuously apply the current to the at least one first LED string 430 and the at least one second LED string 440.

As illustrated in FIG. 4, the at least one first failure sensor 450, and the at least one second failure sensor 460, and the failure result judgment unit 470 may correspond to transistors.

As a sensing result, when the at least one first LED string 430 and the at least one second LED string 440 operate normally, the at least one first failure sensor 450 and the at least one second failure sensor 460 may be turned on, and accordingly a collector end of the LED strings, for example, the at least one first LED string 430 and the at least one second LED string 440 may have a low logic.

When both the at least one first failure sensor 450 and the at least one second failure sensor 460 are turned on, the failure result judgment unit 470 may be turned off and may disallow transmission of failure information to an enabled terminal of the current control unit 420, and accordingly the current control unit 420 may continue a constant current operation.

When a failure of the at least one first LED string 430 and the at least one second LED string 440 is sensed, the at least one first failure sensor 450 or the at least one second failure sensor 460 may be turned off respectively.

When at least one of the at least one first failure sensor 450 and the at least one second failure sensor 460 is turned off, the failure result judgment unit 470 may be turned on by applying an input voltage VIN that may be applied from the outside of the at least one first failure sensor 450 or the at least one second failure sensor 460, and may generate failure information to transmit the generated failure information to the current control unit 420.

When the failure information is received from the failure result judgment unit 470 by a failure of any one of a plurality of LED strings, for example, the at least one first LED string 430 and the at least one first LED string 440, the current control unit 420 may block the entire current with respect to the plurality of the LED strings, for example, the at least one first LED string 430 and the at least one first LED string 440, thereby blocking the entire power supply of the LED array.

The apparatus for sensing the failure may further include a malfunction monitor unit 480 that may provide a malfunction result to the current control unit 420 by recognizing whether malfunctions occur with respect to the at least one first failure sensor 450 and the at least one second failure sensor 460.

When an input voltage is applied greater than a malfunction setting voltage, by applying a voltage equal to the input voltage that may be applied to the current control unit 420, the malfunction monitor unit 480 may control the failure result judgment unit 470 to recognize sensing results of the at least one first failure sensor 450 and the at least one second failure sensor 460.

When the input voltage is gradually increased from a voltage at a point in time before the LED is turned on, at least one failure sensors, for example, the at least one first failure sensor 450 and the at least one second failure sensor 460 may operate although the LED is not yet turned on. That is, the malfunction monitor unit 480 may prevent that the at least one failure sensors, for example, the at least one first failure sensor 450 and the at least one second failure sensor 460 may recognize, as a failure, that the LED may fail to be turned on because of a low input voltage although the LED is normal.

The malfunction monitor unit 480 may further include an operating voltage setting unit 490 that may set the malfunction setting voltage.

The operating voltage setting unit 490 may include at least one resistance, and may set an operating setting voltage by distributing the input voltage to the at least one resistance.

For example, the operating voltage setting unit 490 including resistances R10 and R11 may set a voltage at which the malfunction monitor unit 480 may operate by distributing the input voltage, and may also set an operating voltage of the failure result judgment unit 470 that may be connected with the malfunction monitor unit 480.

According to example embodiments, a power supply of an entire LED may be blocked when a failure occurs with respect to a part of the LED, by sensing a failure of the LED that may be arrayed with a plurality of strings.

According to example embodiments, strings of an entire LED may be configured to be connected in parallel, and accordingly a configuration of an operating circuit may be simple, and cost as well as electro-magnetic compatibility (EMC) noise may be reduced.

The above-described embodiments may be recorded in non-transitory computer-readable media including program instructions to implement various operations embodied by a computer. The media may also include, alone or in combination with the program instructions, data files, data structures, and the like. Examples of non-transitory computer-readable media include magnetic media such as hard disks, floppy disks, and magnetic tape; optical media such as CD ROM discs and DVDs; magneto-optical media such as floptical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described embodiments, or vice versa.

Although embodiments have been shown and described, it would be appreciated by those skilled in the art that changes may be made in these embodiments without departing from the principles and spirit of the disclosure, the scope of which is defined by the claims and their equivalents.

What is claimed is:

1. An apparatus for sensing a failure of a light emitting diode (LED) string, the apparatus comprising:

a current control unit to apply a current to at least one first LED string and at least one second LED string that are connected in parallel with each other;

at least one first failure sensor including a first transistor and configured to sense whether a failure occurs with respect to each of the at least one first LED string;

at least one second failure sensor including a second transistor and configured to sense whether a failure occurs with respect to each of the at least one second LED string; and a failure result judgment unit including a third transistor and configured to transmit failure information to the current control unit when a failure is sensed with respect to at least one of the at least one first LED string and the at least one second LED string, as a sensing result of the at least one first failure sensor and the at least one second failure sensor, wherein:

when a failure of the at least one first LED string is sensed, the first transistor is turned off and the third transistor is turned on, when a failure of the at least one second LED string is sensed, the second transistor is turned off and the third transistor is turned on, and when the failure information is received, the current control unit blocks the entire current that is applied to the at least one first LED string and the at least one second LED string.

2. The apparatus of claim 1, wherein, when both the at least one first LED string and the at least one second LED string operate normally, as the sensing result of the at least one first failure sensor and the at least one second failure sensor, the current control unit continuously applies the current to the at least one first LED string and the at least one second LED string.

3. The apparatus of claim 1, wherein the at least one first failure sensor and the at least one second failure sensor are turned on when the at least one first LED string and the at least one second LED string operate normally, as the sensing result.

4. The apparatus of claim 3, wherein the failure result judgment unit is turned off to disallow transmission of failure information to the current control unit when both the at least one first failure sensor and the at least one second failure sensor are turned on.

5. The apparatus of claim 1, the failure result judgment unit is turned on by applying an input voltage that is applied from the outside of the at least one first failure sensor or the at least one second failure sensor, and generates the failure information and transmits the generated failure information to the current control unit when at least one of the at least one first failure sensor and the at least one second failure sensor is turned off.

6. The apparatus of claim 1, further comprising:

a malfunction monitor unit to provide a malfunction result to the current control unit by recognizing whether malfunctions occur with respect to the at least one first failure sensor and the at least one second failure sensor.

7. The apparatus of claim 1, wherein the malfunction monitor unit controls the failure result judgment unit to recognize sensing results of the at least one first failure sensor and the at least one second failure sensor when the input voltage is applied greater than a malfunction setting voltage, by applying a voltage equal to the input voltage that is applied to the current control unit.

8. The apparatus of claim 7, wherein the malfunction monitor unit comprises:

an operating voltage setting unit to set the malfunction setting voltage.

9. The apparatus of claim 8, wherein the operating voltage setting unit comprises at least one resistance, and sets a malfunction setting voltage by distributing the input voltage to the at least one resistance.

10. A method of sensing a failure of a light emitting diode (LED) string, the method comprising:

applying, by a current control unit, a current to at least one first LED string and at least one second LED string that are connected in parallel with each other;

sensing whether a failure occurs with respect to each of the at least one first LED string and the at least one second LED string and controlling a first transistor and a second transistor based on a result of the sensing; and transmitting failure information to the current control unit by turning on a third transistor, when a failure is sensed with respect to at least one of the at least one first LED string and the at least one second LED string, as the sensing result; and blocking the entire current that is applied to the at least one first LED string and the at least one second LED string, using the current control unit, when the failure information is received, wherein:

when a failure of the at least one first LED string is sensed, the first transistor is turned off and the third transistor is turned on, and when a failure of the at least one second LED string is sensed, the second transistor is turned off and the third transistor is turned on.

11. The method of claim 10, wherein the applying of the current to at least one first LED string and at least one second LED string comprises:

continuously applying the current to the at least one first LED string and the at least one second LED string when both the at least one first LED string and the at least one second LED string operate normally, as the sensing result.

12. The method of claim 10, further comprising:

judging whether a result of sensing a failure with respect to the at least one first LED string and the at least one second LED string is normal.

13. The method of claim 12, wherein the judging of whether the result of sensing the failure is normal comprises:

judging the result of the sensing the failure with respect to the at least one first LED string and the at least one second LED string to be normal when an input voltage is applied greater than a malfunction setting voltage, by applying a voltage equal to the input voltage that is applied to the current control unit.

* * * * *